US011264585B2

(12) United States Patent
Wang et al.

(10) Patent No.: US 11,264,585 B2
(45) Date of Patent: Mar. 1, 2022

(54) FLEXIBLE DISPLAY DEVICE WITH IMPROVED PACKAGING STRUCTURE AND MANUFACTURING METHOD THEREOF

(71) Applicant: BOE TECHNOLOGY GROUP CO., LTD., Beijing (CN)

(72) Inventors: Youwei Wang, Beijing (CN); Song Zhang, Beijing (CN); Tao Sun, Beijing (CN); Peng Cai, Beijing (CN); Huan Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/413,715

(22) Filed: May 16, 2019

(65) Prior Publication Data

US 2020/0052237 A1    Feb. 13, 2020

(30) Foreign Application Priority Data

Aug. 10, 2018  (CN) .......................... 201810907171.0

(51) Int. Cl.
*H01L 51/52* (2006.01)
*H01L 27/32* (2006.01)
(Continued)

(52) U.S. Cl.
CPC ...... *H01L 51/5203* (2013.01); *H01L 27/3246* (2013.01); *H01L 51/0097* (2013.01);
(Continued)

(58) Field of Classification Search
CPC ............. H01L 51/5203; H01L 27/3246; H01L 51/0097; H01L 51/5253; H01L 51/56;
(Continued)

(56) References Cited

U.S. PATENT DOCUMENTS 8,687,469 B1 *  4/2014  Takayama .............. G11B 5/105
                                                  369/13.24
2008/0309226 A1  12/2008  Kim et al.
(Continued)

FOREIGN PATENT DOCUMENTS

CN    103887261       6/2014
CN    106449696 A     2/2017
(Continued)

OTHER PUBLICATIONS

First Office Action dated Dec. 31, 2019 for Chinese Patent Application No. 201810907171.0.
(Continued)

*Primary Examiner* — Lex H Malsawma
*Assistant Examiner* — Laura M Dykes
(74) *Attorney, Agent, or Firm* — Thomas | Horstemeyer LLP (57) ABSTRACT

The present disclosure provides a flexible display device and a manufacturing method thereof. The flexible display device includes a base substrate; a pixel defining layer disposed on the base substrate defining a plurality of light emitting regions; and a first electrode layer disposed on a side of the pixel defining layer away from the base substrate and in light-emitting regions. A thin film encapsulation layer covers the first electrode layer and has protrusions protruding toward the pixel defining layer at a plurality of positions.

12 Claims, 5 Drawing Sheets

(51) Int. Cl.
  *H01L 51/00* (2006.01)
  *H01L 51/56* (2006.01)
(52) U.S. Cl.
  CPC .......... *H01L 51/5253* (2013.01); *H01L 51/56* (2013.01); *H01L 2227/323* (2013.01)
(58) Field of Classification Search
  CPC ....... H01L 2227/323; H01L 2251/5338; H01L 27/3244; Y02E 10/549; Y02P 70/50
  USPC ........................................................... 257/88
  See application file for complete search history.

(56) References Cited

U.S. PATENT DOCUMENTS

| | | | | |
|---|---|---|---|---|
| 2010/0140595 | A1* | 6/2010 | Lee | H01L 51/525 257/40 |
| 2015/0090982 | A1* | 4/2015 | Lin | H01L 27/3246 257/40 |
| 2017/0040397 | A1* | 2/2017 | Choe | H01L 27/3211 |
| 2018/0006267 | A1* | 1/2018 | Sakamoto | H01L 51/5253 |
| 2018/0175311 | A1* | 6/2018 | Jin | H01L 27/3258 |
| 2019/0363146 | A1* | 11/2019 | Takahashi | H01L 27/3246 |

FOREIGN PATENT DOCUMENTS

| | | |
|---|---|---|
| CN | 106684256 | 5/2017 |
| CN | 107104130 | 8/2017 |
| CN | 107808934 | 3/2018 |
| CN | 107852787 | 3/2018 |
| CN | 108232036 | 6/2018 |
| CN | 108258147 | 7/2018 |
| JP | 2008288033 | 11/2008 |

OTHER PUBLICATIONS

Third Office Action for CN Patent Application No. 201810907171.0 dated Feb. 19, 2021.

* cited by examiner

FLEXIBLE DISPLAY DEVICE WITH IMPROVED PACKAGING STRUCTURE AND MANUFACTURING METHOD THEREOF

CROSS REFERENCE TO RELATED APPLICATIONS

The present application is based upon, and claims the benefit of and priority to Chinese Patent Application No. 201810907171.0, filed on Aug. 10, 2018, the entire disclosure of which is hereby incorporated by reference as a part of the present application.

TECHNICAL FIELD

The present disclosure relates to the field of display technology and, more particularly, to a flexible display device and a manufacturing method thereof.

BACKGROUND

Organic electroluminescent devices (OLEDs) are known as promising display devices due to their characteristics, such as self-luminous feature, high brightness, high contrast, low operating voltage, and ability to operate as a flexible display.

In recent years, with the development of curved screens and foldable display devices, various flexible display devices having the ability to bend have been developed.

It should be noted that the information disclosed in the Background Section above is only for improve understanding of the background of the present disclosure, and thus may include information that does not constitute prior art known to those of ordinary skill in the art.

SUMMARY

According to one aspect of the present disclosure, there is provided a flexible display substrate, including:
a base substrate,
a pixel defining layer disposed on the base substrate and configured to define a plurality of light emitting regions;
a first electrode layer disposed on a side of the pixel defining layer away from the base substrate and in the light emitting regions;
a thin film encapsulation layer covering the first electrode layer and having a plurality of protrusions protruding toward the pixel defining layer at a plurality of positions.

In an embodiment, the display substrate further includes: a capping layer disposed between the first electrode layer and the thin film encapsulation layer.

In an embodiment, the protrusion passes through the capping layer and contacts with the first electrode layer.

In an embodiment, the protrusion passes through the first electrode layer and contacts with the pixel defining layer.

In an embodiment, the protrusion protrudes into the pixel defining layer.

In an embodiment, an orthogonal projection of the protrusion on the base substrate is within a range of an orthogonal projection of the pixel defining layer on the base substrate.

In an embodiment, the protrusion has at least one of a cylindrical shape, a prismatic shape, a truncated cone shape, a prismatic shape, a conical shape, and a pyramidal shape.

In an embodiment, the protruding portions are uniformly distributed in the flexible display device, or the protruding portions are formed to have a larger distribution density at a peripheral region of the flexible display substrate than at a central region of the flexible display substrate.

In an embodiment, the light emitting region further includes a second electrode layer disposed on a side of the first electrode layer adjacent to the base substrate and a light emitting layer disposed between the first electrode layer and the second electrode layer.

According to another aspect of the present disclosure, there is provided a flexible display device including: a flexible display substrate according to other aspect of the present disclosure.

According to another aspect of the present disclosure, there is provided a manufacturing method of a flexible display substrate, including:
forming a pixel defining layer on a base substrate to define a plurality of light emitting regions;
forming a first electrode layer to cover a side of the pixel defining layer away from the base substrate and the light emitting regions; and
forming a thin film encapsulation layer, the thin film encapsulation layer covering the first electrode layer and having protrusions protruding toward the pixel defining layer at a plurality of positions.

In an embodiment, a method of forming a thin film encapsulation layer, the thin film encapsulation layer covering the first electrode layer and having protrusions protruding toward the pixel defining layer at a plurality of positions, is described, where the method includes:
forming a recess in the first electrode layer; and
forming a thin film encapsulation layer covering the first electrode layer, such that at least a portion of the thin film encapsulation layer is filled into the recess to form the protrusion.

In an embodiment, the method further includes: before forming the thin film encapsulation layer, forming a capping layer such that the capping layer is disposed between the first electrode layer and the thin film encapsulation layer.

In an embodiment, forming a thin film encapsulation layer, the thin film encapsulation layer covering the first electrode layer and having protrusions protruding toward the pixel defining layer at a plurality of positions includes:
forming a recess in the capping layer; and forming the thin film encapsulation layer such that at least a portion of the thin film encapsulation layer is filled into the recess to form the protrusion.

In an embodiment, forming a thin film encapsulation layer, the thin film encapsulation layer covering the first electrode layer and having protrusions protruding toward the pixel defining layer at a plurality of positions includes:
forming a recess in the pixel defining layer; and
forming the thin film encapsulation layer such that at least a portion of the thin film encapsulation layer is filled into the recess to form the protrusion.

It should be understood that both the foregoing general description and the following detailed description are exemplary and explanatory only and are not restrictive of the disclosure.

BRIEF DESCRIPTION OF THE DRAWINGS

The accompanying drawings, which are intended to provide a further understanding of the present disclosure and constitute a part of the specification, serve to explain the principles of the present disclosure together with the following description, and do not constitute a limitation on the present disclosure. In the drawings.

DETAILED DESCRIPTION

In order to make the above objectives, features, and advantages of the present disclosure more apparent, the present disclosure will be further described in detail with reference to the drawings and specific embodiments. It should be noted that the embodiments and the features in the embodiments in the present application may be combined with each other without conflict.

In the following description, numerous specific details are set forth in order to facilitate a full understanding of the present disclosure, but the present disclosure also be practiced in other different ways than those described herein. Therefore, the scope of protection of the present disclosure is not limited by the specific embodiments disclosed below.

As shown in FIGS. 1A to 1C and FIG. 2, an embodiment of the present disclosure provides a flexible display device including a flexible display base substrate. The flexible display base substrate includes: a pixel defining layer PDL; a plurality of light emitting regions defined by the pixel defining layer PDL, such as a pixel PX, that are configured to emit light for the display; a capping layer 110 formed to cover the pixel PX; and a thin film encapsulation layer 120 covering the capping layer 110 having protrusions 125 protruding toward the pixel defining layer PDL at a plurality of positions.

Figure 1A:
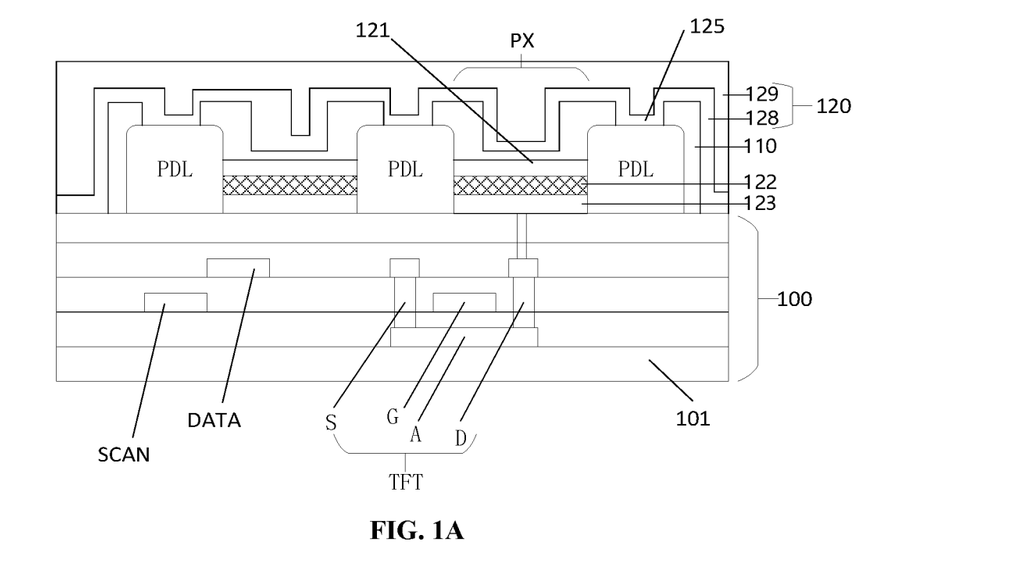
FIGS. 1A to 1C are cross sectional views of a flexible display device according to an embodiment of the present disclosure.
Figure 1B:
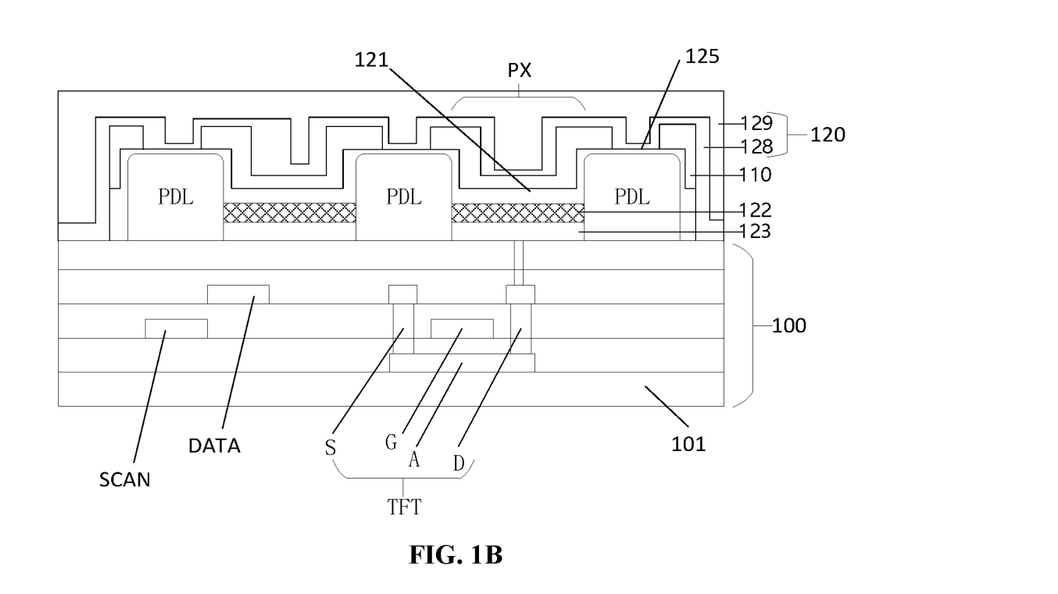
Figure 1C:
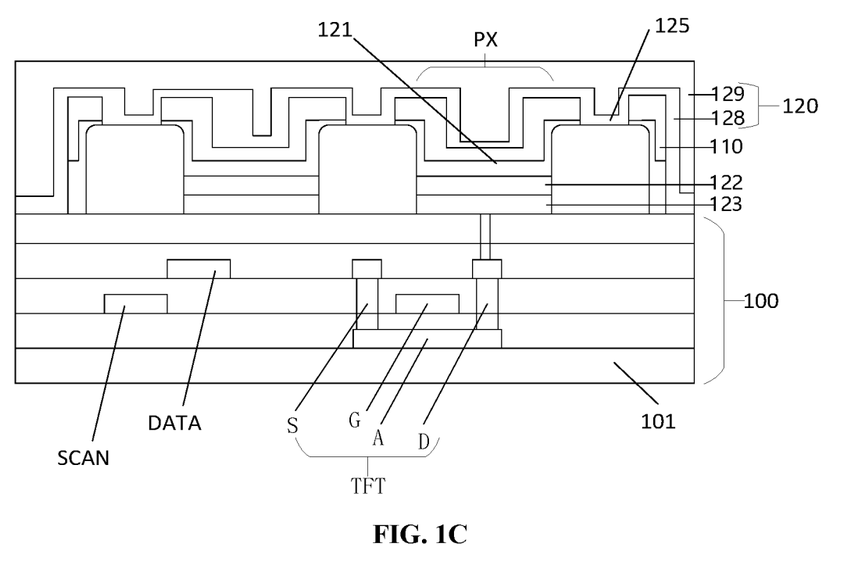

According to an embodiment of the present disclosure, as shown in FIG. 1A, an orthogonal projection of the protrusion 125 in a plane of the pixel defining layer PDL overlaps or substantially overlaps with the pixel defining layer PDL. For example, the orthogonal projection of the protrusion 125 on the base substrate of the flexible display substrate is within a range of an orthogonal projection of the pixel defining layer PDL on the base substrate. In other words, the protrusion 125 may be disposed right above the pixel defining layer PDL. Additionally, in one embodiment, the protrusion 125 may be in contact with the pixel defining layer PDL through the capping layer 110.

According to the above described embodiments of the present disclosure, the thin film encapsulation layer 120 has a plurality of protrusions 125 protruding into the capping layer 110 such that the protrusions 125 function as "nails" wedged into the capping layer 110. Therefore, the contact area can be increased, thereby increasing the interfacial adhesion which can prevent a peeling phenomenon between the layers during the bending process of the flexible display device, and improve the stability of the curved portion, thereby improving the yield rate and service life of the flexible display device. In an embodiment shown in FIG. 1A, the protrusions 125 extend toward the pixel defining layer PDL until they are in contact with the pixel defining layer PDL, and thus can provide the largest possible contact area. However, those skilled in the art will appreciate that the depth at which the protrusions 125 protrude into the capping layer 110 is not limited thereto, and in some embodiments, the protrusions 125 may protrude to a predetermined depth in the capping layer 110 instead of completely penetrating through the capping layer 110. In other embodiments, the protrusions 125 may also protrude further into an upper surface of the pixel defining layer PDL to further increase the contact area to provide better interfacial adhesion.

The pixel defining layer PDL may be formed on a base 100. For example, as shown in FIG. 1A, the base may include a base substrate 101, and signal lines such as a scan line SCAN, a data line DATA, etc. and driving circuits such as thin film transistors (TFTs) formed on the base substrate 101. As shown in the embodiment of FIG. 1A, the driving circuit includes a thin film transistor TFT having a source electrode S, a drain electrode D, a gate electrode G, and an active region A. The source electrode S receives a data signal from the data line, and the gate electrode G receives a scan signal from the scan line. In response to the scan signal, the thin film transistor TFT transmits the data signal to the pixel PX through the drain electrode D. It should be understood that FIG. 1A only schematically shows examples of the signal lines and the driving circuits, but the present disclosure is not limited to the embodiments shown in the drawings. In practical application, depending on the specific configuration of the display device, the layout of the signal lines and the driving circuit may be more complicated, for example, including a compensation circuit. Those skilled in the art have mastered various techniques of how to arrange signal lines and drive circuits in the base 100, and thus will not be elaborated herein.

As shown in FIG. 1A, the pixel PX may include a first electrode 121, a light emitting layer 122, and a second electrode 123. The capping layer 110 may cover the first electrode 121. In one embodiment, the capping layer 110 may be formed integrally with the first electrode 121. In other embodiments of the present disclosure, the first electrode 121 may also be formed to cover the light emitting layer 122 and the pixel defining layer PDL. The light emitting layer 122 may cover the second electrode 123. The second electrode 123 is disposed on a side of the first electrode 121 adjacent to the base substrate. In addition, in another embodiment according to the present disclosure, the capping layer 110 may be omitted and the thin film encapsulation layer 120 is formed to directly cover the first electrode 121, in which case the protrusion 125 in the thin film encapsulation layer may protrude into the first electrode 121.

In one embodiment, the second electrode 123 can be electrically connected to the drive circuit to receive a data signal from the drive circuit. For example, the second electrode 123 may be electrically connected to the drain electrode D of the thin film transistor TFT to receive a corresponding data signal.

The light emitting layer 122 may include an organic light emitting material to emit light having a predetermined brightness in response to a data signal received by the second electrode 123. Although not shown, the light emitting layer 122 may further include various functional layers that have auxiliary functions, such as a hole injection layer, a hole transport layer, an electron injection layer, an electron transport layer, and the like.

The first electrode 121 covers the light emitting layer 122. The first electrode 121 may be formed of a transparent conductive material such that light from the light emitting layer 122 may be transmitted to the outside. The first electrode 121 may also be formed to cover a common electrode of all the pixels PXs and structures between the pixels PXs (for example, the pixel defining layers PDLs, see, for example, FIG. 1B). In this case, the protrusion 125 may be in contact with the first electrode 121 through the capping layer 110 (see, for example, FIG. 1B). Alternatively, the protrusion 125 may further protrude to the inside of the first electrode 121, contact with the pixel defining layer PDL through the first electrode 121 (see, for example, FIG. 1C), or protrude to the inside of the upper surface of the pixel defining layer PDL.

The capping layer 110 may be formed to cover the first electrode 121. In the present embodiment, the capping layer 110 may be formed on the upper surface of the first electrode 121, and the capping layer 110 may be formed of a material having a large refractive index and a small light absorption coefficient (high transmittance), thereby improving light extraction efficiency. It should be understood that, in the present disclosure, the capping layer 110 and the first electrode 121 may be integrally formed.

The thin film encapsulation layer 120 covers on the capping layer 110 to protect the internal structure of the flexible display device from the external environment (e.g., oxygen or water). The thin film encapsulation layer 120 may include a single layer or a multilayer structure. For example, as shown in FIG. 1A, the thin film encapsulation layer 120 may include at least a first encapsulation layer 128 and a second encapsulation layer 129. The first encapsulation layer 128 may include an inorganic material and the second encapsulation layer 129 may include an organic material. Inorganic materials generally have better water-oxygen barrier effects, and organic materials generally have better flexibility. By utilizing the respective advantages of organic materials and inorganic materials, the film encapsulation layer 120 can have a better encapsulation effect. The embodiment of FIG. 1A shows a first encapsulation layer 128 and a second encapsulation layer 129. However, the disclosure is not limited thereto, and the thin film encapsulation layer 120 may include more layers, such as a structure in which a plurality of inorganic layers and a plurality of organic layers are alternately stacked.

The protrusion 125 may be formed by forming in advance a recess (a via hole, a blind via, or the like) in the capping layer 110, and then forming a material of the thin film encapsulation layer 120 in the recess. In the present embodiment, the protruding portion 125 may have at least one of a cylindrical shape, a prismatic shape, a truncated cone shape, a prismatic shape, a conical shape, and a pyramidal shape. However, the present disclosure is not limited thereto, and the protruding portion 125 may have an irregular shape according to actual needs, for example, such that its side wall has a curved shape or an irregular fold line to further increase the contact area.

Figure 2:
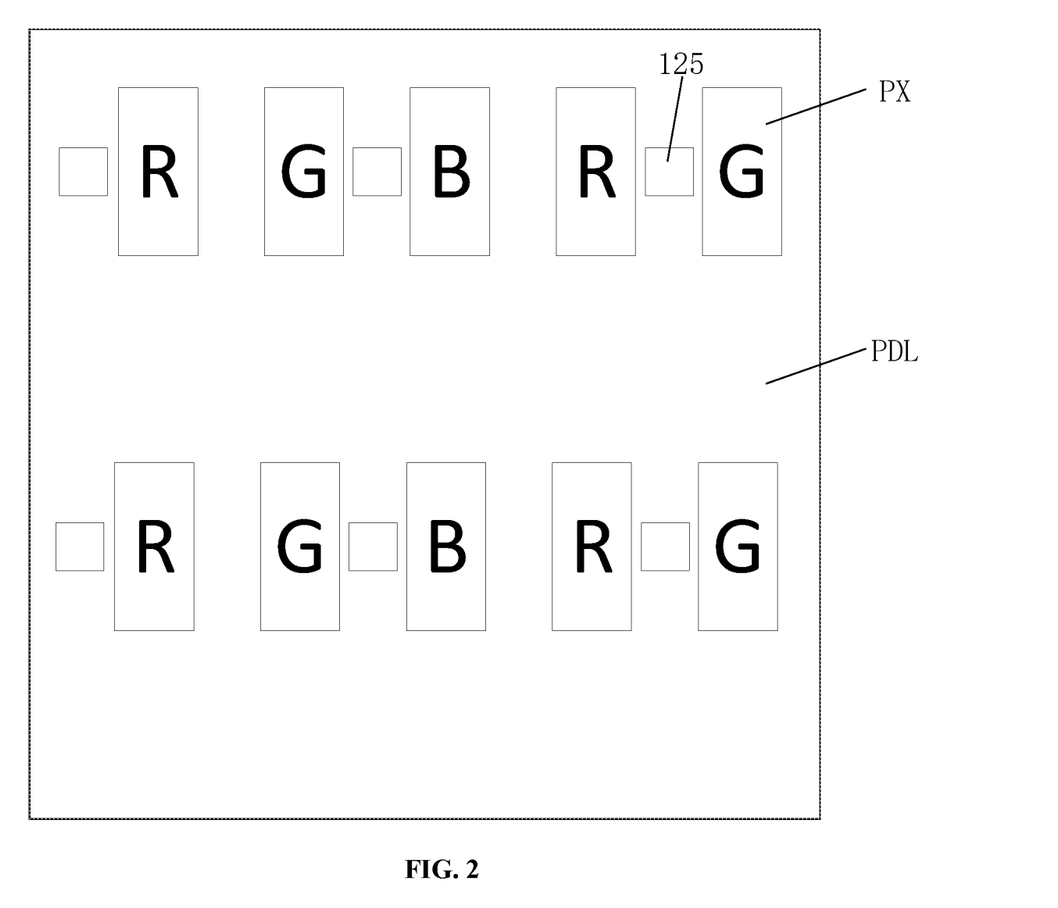
FIG. 2 is a top plan view of a flexible display device according to an embodiment of the present disclosure.

FIG. 2 shows a top view of a flexible display device according to an embodiment of the present disclosure. As shown in FIG. 2, the pixel defining layer PDL defines a plurality of pixels PXs on the flexible display device. A plurality of PXs may be arranged in a matrix in the display device, and may be configured to emit light of different colors, such as red (R), green (G), and blue (B), respectively, to achieve color display. However, the present disclosure is not limited thereto, and depending on the specific configuration of the display device, the pixels PXs may also adopt a configuration that emits light of other colors, such as RGBW or the like.

The protrusion 125 is formed at a position corresponding to the pixel defining layer PDL. A plurality of protrusions 125 may be formed on the display device according to the present disclosure, and these protrusions 125 are evenly distributed in the display device. For example, as shown in FIG. 2, a protrusion 125 is formed at a position of the pixel defining layer PDL between every two pixels. However, the present disclosure is not limited thereto, and those skilled in the art should understand that the protrusions 125 may have other distances between them, for example, the protrusions 125 are formed every 5 pixels, 10 pixels, or even between each pixel. In addition, FIG. 2 illustrates that the protrusions 125 are disposed between pixels adjacent to each other in the row direction, but the present disclosure is not limited thereto, and the protrusions 125 may be formed between pixels adjacent in the column direction or at other positions of the pixel defining layer PDL. It should also be understood that the protrusions 125 are not limited to being formed in an axisymmetric or centrally symmetrical pattern, but may also be partially distributed in an irregular pattern as long as they are uniformly arranged over the entire range of the display device.

Further, in an embodiment of the present disclosure, the protrusion 125 may be formed to have a larger distribution density at the peripheral portion of the flexible display substrate than at the central region of the flexible display substrate. For example, when the flexible display substrate is deformed by stretching or bending, a larger stress may be generated at the peripheral region than at the central region, so that denser protrusions may be formed in the peripheral region, which can prevent the peeling phenomenon in a region where the stress is relatively large.

Figure 3A:
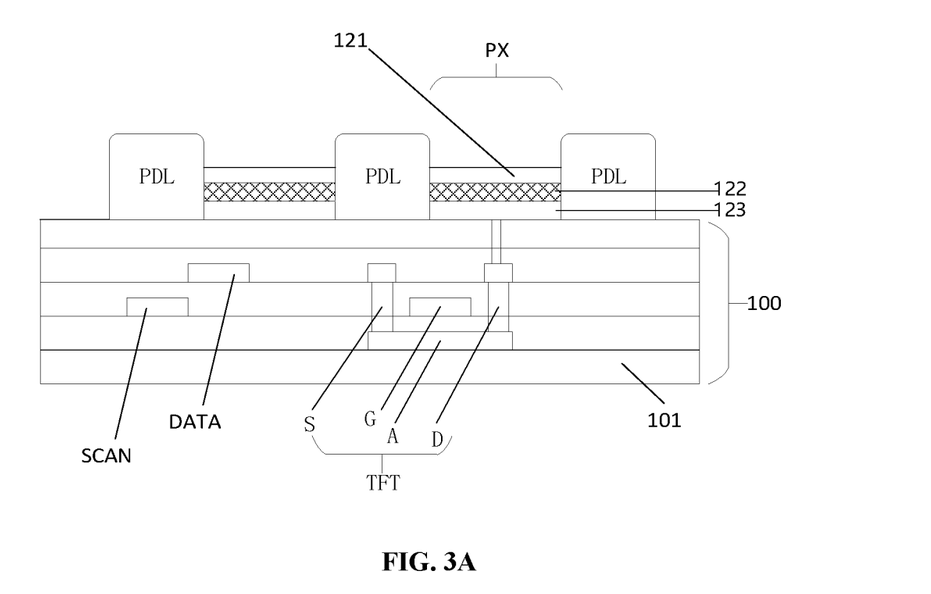
FIGS. 3A to 3C are cross sectional views illustrating a manufacturing method of a flexible display device according to an embodiment of the present disclosure.
Figure 3B:
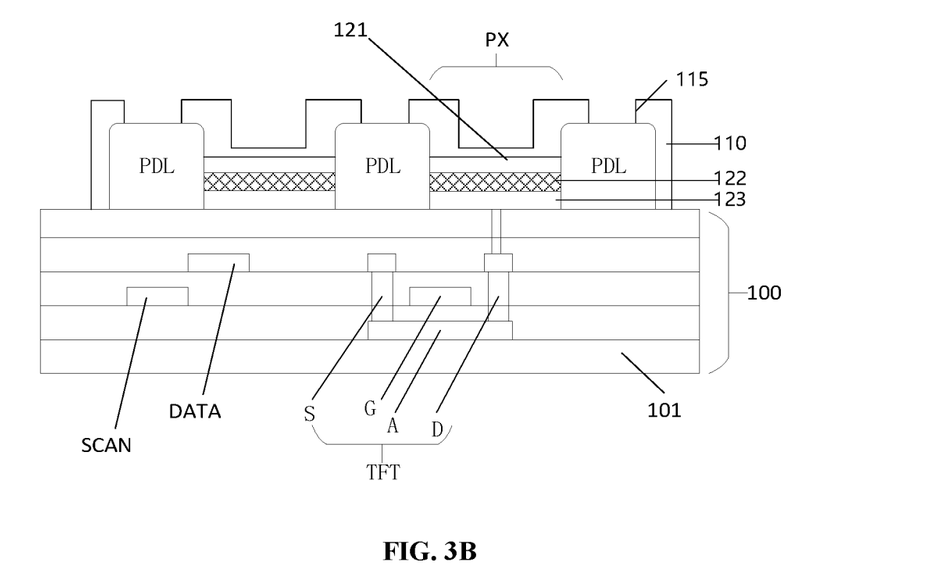
Figure 3C:
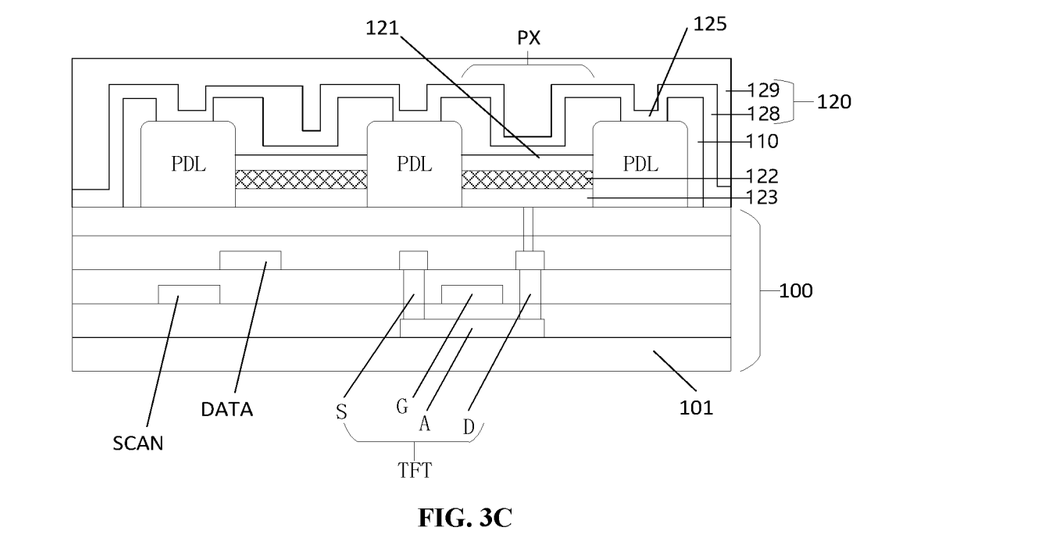

FIGS. 3A to 3C are cross sectional views illustrating a manufacturing method of a flexible display device according to an embodiment of the present disclosure. Referring to FIGS. 3A-3C, the method can include multiple steps as described below.

Referring to FIG. 3A, a pixel defining layer PDL is formed on a substrate 100 to define a plurality of light emitting regions, such as pixels PXs, which are configured to emit light for display. As shown in FIG. 3, a pixel defining layer PDL is formed on the substrate 100 to define a pixel region; a second electrode 123 is formed in the pixel region, and the second electrode is coupled to a driving circuit in the substrate 100 (for example a thin film transistor TFT); a light emitting layer 122 covering the second electrode; and a first electrode 121 covering the light emitting layer and the pixel defining layer.

Referring to FIG. 3B, a capping layer 110 is formed to cover the pixel PX. As shown in FIG. 3, a recess 115 is formed in the capping layer 110. The recess 115 may be formed to correspond to a position where the protrusion 125 according to the present disclosure is to be formed.

In one embodiment of the present disclosure, the capping layer 110 may be patterned using a mask having a corresponding pattern to form the recess 115.

Referring to FIG. 3C, a thin film encapsulation layer 120 covering the capping layer 110 is formed on the basis of FIG. 3B. As shown in FIG. 3C, at least a portion of the thin film encapsulation layer is filled into the recess 115, thereby forming a plurality of protrusions 125.

For specific details in the method embodiments, reference may be made to the device embodiments previously described with reference to FIGS. 1 and 2, and details are not repeated herein.

The thin film encapsulation layer of the flexible display device according to the present disclosure has a plurality of protrusions protruding into the capping layer, thereby increasing the contact area, thereby increasing the interfacial adhesion, which can prevent a peeling phenomenon between the layers during the bending process of the flexible display device, and improve the stability of the curved portion, thereby improving the yield rate and service life of the flexible display device.

In the present disclosure, the terms "first" and "second" are used for the purpose of description only, and are not to be construed as indicating or implying relative importance; the term "plurality" means two or more. For those skilled in the art, the specific meanings of the above terms in the present disclosure can be understood on a case-by-case basis.

The above is only preferred embodiments of the present disclosure, and is not intended to limit the present disclosure, and various modifications and changes can be made to the present disclosure. Any modifications, equivalent substitutions, improvements, etc. made within the spirit and the scope of the present disclosure are intended to be included within the scope of the present disclosure.

What is claimed is:

1. A flexible display substrate, comprising:
   a base substrate;
   a pixel defining layer disposed on the base substrate and configured to define a plurality of light emitting regions;
   a first electrode layer disposed on a side of the pixel defining layer away from the base substrate and in the light emitting regions;
   a thin film encapsulation layer covering the first electrode layer and having a plurality of protrusions protruding toward the pixel defining layer at a plurality of positions; and
   a capping layer formed of a material having a large refractive index and a small light absorption coefficient disposed between the first electrode layer and the thin film encapsulation layer to improve light extraction efficiency, the plurality of protrusions being protruded into the capping layer, wherein:
   an orthogonal projection of at least one of the plurality of the protrusions on the base substrate is within a range of an orthogonal projection of the pixel defining layer on the base substrate;
   the plurality of protrusions are formed to have a larger distribution density at a peripheral region of the flexible display substrate than at a central region of the flexible display substrate; and
   the plurality of protrusions are disposed between adjacent light emitting regions of the plurality of light emitting regions in a row direction or in a column direction.

2. The flexible display substrate of claim 1, wherein at least one of the plurality of protrusions is in physical contact with the first electrode layer through the capping layer.

3. The flexible display substrate of claim 1, wherein at least one of the plurality of protrusions is in physical contact with the pixel defining layer through the first electrode layer.

4. The flexible display substrate of claim 1, wherein at least one of the plurality of protrusions is protruding into the pixel defining layer.

5. The flexible display substrate of claim 1, wherein at least one of the plurality of protrusions has at least one of: a cylindrical shape, a prismatic shape, a truncated cone shape, a prismatic shape, a conical shape, and a pyramidal shape.

6. The flexible display substrate of claim 1, further comprising:
   a second electrode layer disposed on a side of the first electrode layer adjacent to the base substrate in the light emitting regions; and
   a light emitting layer disposed between the first electrode layer and the second electrode layer in the light emitting regions.

7. The flexible display substrate according to claim 1, wherein the flexible display substrate is implemented in a flexible display device.

8. A manufacturing method of a flexible display substrate, comprising:
   forming a pixel defining layer on a base substrate to define a plurality of light emitting regions;
   forming a first electrode layer to cover a side of the pixel defining layer away from the base substrate and the light emitting regions; and
   forming a thin film encapsulation layer, the thin film encapsulation layer covering the first electrode layer and having protrusions protruding toward the pixel defining layer at a plurality of positions, wherein:
   before forming the thin film encapsulation layer, the method further comprises forming a capping layer with a material having a large refractive index and a small light absorption coefficient between the first electrode layer and the thin film encapsulation layer to improve light extraction efficiency, the protrusions being protruded into the capping layer;
   an orthogonal projection of at least one of the plurality of protrusions on the base substrate is within a range of an orthogonal projection of the pixel defining layer on the base substrate;
   the plurality of protrusions are formed to have a larger distribution density at a peripheral region of the flexible display substrate than at a central region of the flexible display substrate; and
   the plurality of protrusions are disposed between adjacent light emitting regions of the plurality of light emitting regions in a row direction or in a column direction.

9. The method of claim 8, wherein forming the thin film encapsulation layer, the thin film encapsulation layer covering the first electrode layer and having the plurality of protrusions protruding toward the pixel defining layer at the positions, further comprises:
   forming a recess in the first electrode layer; and
   forming the thin film encapsulation layer covering the first electrode layer, at least a portion of the thin film encapsulation layer being filled into the recess to form the plurality of protrusions.

10. The method of claim 8, wherein forming the thin film encapsulation layer, the thin film encapsulation layer covering the first electrode layer and having the plurality of protrusions protruding toward the pixel defining layer at the positions, further comprises:
    forming a recess in the capping layer; and
    forming the thin film encapsulation layer, at least a portion of the thin film encapsulation layer being filled into the recess to form the plurality of protrusions.

11. The method of claim 8, wherein forming the thin film encapsulation layer, the thin film encapsulation layer covering the first electrode layer and having the plurality of protrusions protruding toward the pixel defining layer at the positions, further comprises:
    forming a recess in the pixel defining layer; and
    forming the thin film encapsulation layer, and at least a portion of the thin film encapsulation layer being filled into the recess to form the plurality of protrusions.

12. A flexible display device comprising a flexible display substrate, wherein the flexible display substrate comprises:
    a base substrate;
    a pixel defining layer disposed on the base substrate that defines a plurality of light emitting regions;

a first electrode layer disposed on a side of the pixel defining layer away from the base substrate and in the light emitting regions;

a thin film encapsulation layer covering the first electrode layer and having a plurality of protrusions protruding toward the pixel defining layer at a plurality of positions; and a capping layer formed of a material having a large refractive index and a small light absorption coefficient disposed between the first electrode layer and the thin film encapsulation layer to improve light extraction efficiency, the plurality of protrusions protruding into the capping layer, wherein:

an orthogonal projection of at least one of the plurality of the protrusions on the base substrate is within a range of an orthogonal projection of the pixel defining layer on the base substrate;

the plurality of protrusions are formed to have a larger distribution density at a peripheral region of the flexible display substrate than at a central region of the flexible display substrate; and the plurality of protrusions are disposed between adjacent light emitting regions of the plurality of light emitting regions in a row direction or in a column direction.

* * * * *